United States Patent [19]

Goad et al.

[11] Patent Number: 5,370,923
[45] Date of Patent: Dec. 6, 1994

[54] PHOTOLITHOGRAPHY TEST STRUCTURE

[75] Inventors: Howard S. Goad; Derick J. Wristers; James H. Hussey, Jr.; Michael A. Hillis; William C. Chapman, all of Austin, Tex.

[73] Assignee: Advanced Micro Devices, Inc., Sunnyvale, Calif.

[21] Appl. No.: 23,078

[22] Filed: Feb. 26, 1993

[51] Int. Cl.⁵ .............................................. B32B 9/00
[52] U.S. Cl. .................................. 428/209; 428/901; 250/332; 250/352; 156/633
[58] Field of Search ............... 428/901, 209; 250/332, 250/352; 156/633

[56] References Cited

U.S. PATENT DOCUMENTS

| | | | |
|---|---|---|---|
| 4,302,498 | 11/1981 | Faith, Jr. | 428/209 |
| 4,336,295 | 6/1982 | Smith | 428/195 |
| 4,654,269 | 3/1987 | Lebrer | 428/428 |
| 4,732,801 | 3/1988 | Joshi | 428/198 |
| 4,899,439 | 2/1990 | Potter et al. | 428/901 |

Primary Examiner—Patrick J. Ryan
Assistant Examiner—Kam F. Lee
Attorney, Agent, or Firm—Kevin L. Daffer

[57] ABSTRACT

A photolithography test structure is provided for measuring the amount of notching associated with photolithography processing. The test structure includes a curved insulating structure placed in close spaced proximity with a conductive, interconnect structure. A pair of conductive pads are deposited at opposite ends of the interconnect structure for measuring the resistance through the interconnect. Depending upon the amount of notching associated with the interconnect, resistance readings will vary. Test areas containing notched interconnect can be compared with controlled areas specifically designed not to have notching in order to determine relative changes in resistance, and to correlate that resistance with notching magnitude. The insulating structure, interconnect structure and conductive pads are processed upon the same substrate material containing the resulting product requiring testing.

9 Claims, 3 Drawing Sheets

PHOTOLITHOGRAPHY TEST STRUCTURE

BACKGROUND OF THE INVENTION

1. Field of the Invention

This invention relates to photolithography and more particularly to a photolithography test structure for electrically measuring the amount of notching associated with the fabrication of a conductive component.

2. Background of the Relevant Art

Lithography, also referred to as photolithography, and sometimes as pattern printing, is a processing methodology by which a pattern is transferred to a target surface or substrate. A pattern is transferred from a mask onto a substrate, which involves the steps of coating, exposing and developing photosensitive resist placed across the substrate. The substrate is first prepared for patterning by removing foreign materials from the substrate surface. An oxide such as, e.g., $SiO_2$ is then allowed to grow across the clean substrate. Photolithography processing may begin by placing the photosensitive material, often called "photoresist" or "resist", across the prepared substrate surface. Spin coating a liquid photoresist across the substrate is well known, and provides a suitable thin film of protective covering upon the substrate area. The mask is then placed in contact with the photoresist or in close proximity with the photoresist. A light source is configured behind the mask allowing radiation to pass through select portions of the mask and onto the photoresist. Emitted radiation is preferably within the ultraviolet (UV) region. A pattern of photoresist exposed to the UV light is either polymerized or solubilized depending upon the type of photoresist used. A polymerized pattern is one which becomes hardened and substantially resistant to selective removal. On the other hand, solubilized pattern is softened and easily dissolved by a solvent.

Photoresist can be either positive or negative. Negative resist includes resist which becomes polymerized at the locations where UV light strikes the resist. Exposed negative resist becomes polymerized and is considerably less soluble in the developing solvent. Conversely, positive resist includes resist which becomes solubilized at regions exposed to UV light. Exposed positive photoresist becomes considerably more soluble in the developing solvent. The formulation of photoresist (either negative or positive) is well known. Oftentimes, photoresist includes a resist polymer combined with a sensitizer. The sensitizer makes the polymer light-sensitive. An adhesion promoter can also be added to allow the resin to adhere to the substrate material. A thinner may also be added to the viscous resin to allow it to spread more uniformly over the substrate. Numerous types of chemical compositions for each of these components are well known in the art. Typical negative resists include a combination of cyclized polyisoprene polymer resin with bis-azido compounds. A suitable positive resist includes phenol formaldehyde novolak resin combined with a naphthoquinone diazide sensitizer. The chemical composition for positive resist may depend upon the type of solvents or developers used to remove the solubilized photoresist.

After the photoresist is coated across the substrate and exposed to UV light, solubilized photoresist is then removed or developed. Various diluents or developers such as nitrobenzene, acetic acid, xylene and benzene can be used to remove a negative solubilized photoresist. Positive resist developers may include sodium hydroxide, potassium hydroxide, or tetramethylammonium hydroxide to form an alkaline solution. It is understood, however, that other formulations of diluents may be used, as would be apparent to one of skill in this art. The above diluents are but a few exemplary solvents chosen from a long list of suitable developing agents. The chemical composition of a selected solvent can be altered provided the essential function of the solvent remains, namely, to remove all the photoresist at select areas while keeping almost all the underneath layer intact.

After select areas of photoresist are removed, the resulting substrate is subjected to an etchant. Surface areas not having overlying photoresist are etched to remove unwanted, underlying material such as silicon dioxide, silicon nitride, or metallization. Various types of etchants may be used such as chemical (wet etchant), electrical chemical, pure plasma etchant, reactive ion etchant (RIE), ion beam milling, sputtering and high temperature vapor etchant. Wet etchant includes various aqueous etching solutions such as HF-based solutions for silicon substrate, hot $H_3PO_4$ for silicon nitride and cold $H_3PO_4$ for aluminum metallization. Another popular etching methodology includes plasma etchants, and combination plasma/RIE etchant performed in low pressure gaseous plasma. Plasma etchants are more commonly used in fine geometry applications. Plasma etchants usually contain fluorine or chlorine, for example, $CF_4$. Like plasma etching, ion beam milling is classified as dry etchant, and is often performed in a vacuum (typically $10^{-5}$ torr). Sputtering done in relatively low vacuum is quite slow, and may produce surface damage. Vapor etching generally requires temperatures in the order of 1000° C. and is mostly used in an in-situ cleanup before epitaxial deposition. As such, wet etching, plasma etching, or the combination plasma/RIE etching and vapor phase etching provide suitable etching methodology and remain well known to those of skill in this art.

Etching completely through thin layers such as silicon dioxide present a difficult set of problems encountered by the process engineer. The etch material used is ordinarily selective and will slow or stop its etching action when the underlying desired layer is reached. It may, however, continue to etch laterally and into, e.g., silicon dioxide material underneath non-removed photoresist. Wet etching is particularly prone to this problem, generally known as "undercutting." Etchants that behave in this manner are often defined as "isotropic." That is, isotropic etchants are those which etch at the same rate in all directions. Anisotropic etching implies that a substantial difference exists in etch rates in different directions. For example, anisotropic etching may mean an appreciable etching in a direction normal to the substrate surface and essentially no etching laterally. Thus, there appears differing etch rates in different crystallographic directions. Anisotropic etch mechanisms often appear in combination plasma/RIE etching processes. Due to plasma/RIE etchants' ability to anisotropically etch, plasma/RIE etchants are preferably used for fine-line geometries where undercutting must be minimized.

Undercutting presents a serious problem during the etching process. However, before etching is begun, another problem may arise completely dissimilar from undercutting but which may have the same effect.

Namely, "notching" occurs during photoresist exposure/develop and prior to etching. Notching is defined herein as the shift or movement of the demarcation line between solubilized and polymerized photoresist. The image upon the mask and associated image edge should be duplicated at an exact, corresponding location upon the substrate. However, select image edges are often shifted between the mask and the substrate due to the relative shift in the demarcation line. Shift in demarcation causes more or less photoresist to be developed on one side of the line than what should be developed in an ideal situation without notching. As such, the image developed upon the substrate will appear shifted, larger or smaller than the same image upon the mask. For example, positive photoresist may be overdeveloped between the mask images transferred over photoresist causing the resulting image on the substrate to appear shifted or smaller than its target size. Notching is therefore a problem associated with all photolithography processes involving organic-based, positive photoresist.

Illustrated in FIGS. 1–3 are photolithography steps utilizing positive photoresist and a near proximity mask according to a conventional design. It is understood, however, that any type of photoresist may be used as well as any type of optical projection printing provided the designed result is achieved—i.e., the transferal of a mask pattern upon a substrate topography.

Referring to FIG. 1, a substrate 12 such as bulk silicon substrate can be used upon which an integrated circuit may be produced. Substrate 12 may, in the alternative, be any substrate upon which a conductive trace element can be produced thereupon, including phenolic-impregnated material or epoxy-impregnated glass upon which a printed wiring board or printed circuit board can be produced. Still further, substrate 12 may include a printed wiring board upon which trace elements are placed. Shown in FIG. 1, substrate 12 may be substantially planar having diffusion areas 14 placed into the upper surface of substrate 12 to form semiconductor diffusion regions commonly found in an integrated circuit. Still further, field oxide regions 16 are placed between active areas, the field oxide may be several thousand Angstroms thick. Accordingly, diffusion areas 14 are placed within substrate 12 between field oxide regions 16 and gate areas 18. Self-aligned diffusion process is commonly known in the art and often defined as self-aligned polysilicon gate process.

Photolithography is used and repeated to place each of the thin films 14, 16, and 18 onto and into substrate 12. A resulting topography may include many steep peaks and valleys of uneven upper surface. An insulating barrier 20 may be placed across the uneven topography to provide electrical isolation from the upper, subsequent-placed layers. Barrier 20 is generally thin and may be several hundred Angstroms, and is placed between gate 18 and substrate 12 to form a gate oxide region 22. Barrier 20 may also be placed over the top of gate 18 as shown. Barrier 20 may be made from thermal oxides generated from a silicon reaction with oxygen at high temperatures or, alternatively, barrier 20 can be made from chemical vapor deposition (CVD) oxides which are well known in the art. Another type of barrier 22 can be placed above gate area 18 in lieu of or in addition to barrier 20. Barrier 22 can be made of organic silicates, often called "glass." Glass material is a dielectric and provides inner layer insulation between metallization layers and between metallization and lower active regions. The inner layer insulation can be spun over the top of the uneven upper surface. Inner layer dielectrics, such as alkoxysilane, acyloxysilane, tetraethoxysilane (TEOS), phosphosilicate (PSG) or silicon polymer may be used in their liquid form and placed across substrate 12 similar in manner to photoresist placement. The organic silicate is converted to a silica film when heated. There are varying types of glass which can be used. PSG or TEOS generally decomposed into silica between 200° C. to 900° C. depending upon the thickness of the film.

Silica is ordinarily used as diffusion dopant sources and therefore can have doping impurity added to the material. Still further, PSG or TEOS can be used to mask diffusions for lead protection. Even still further, PSG or TEOS can be used as spinons for interlevel insulator. In FIG. 1, barrier 22 is used to insulate between gate 18 and overlying metallization layer 24. In order to remain as an insulating layer, barrier 22 must remain crack-free over the operating temperature range and not produce enough stress in the substrate to introduce the defects. The primary advantage of using inner layer dielectrics is the simplicity by which they can be applied to an upper substrate topography. When glasses are used as an interlevel insulator, they have the additional advantage of topography planarization. As shown in FIG. 1, barrier 22 is spun on to help smooth the valleys and peaks of the underlying topography to form a more planar upper surface. As will be appreciated below, a more planar surface helps reduce the notching effect present in photolithography.

Placed across the top of metallization layer 24 is photoresist 26. Thus, FIG. 1 illustrates current processing of metallization layer 24 using photoresist 26. Processing involves transferal of mask 28, and pattern arranged therein, upon metallization 24. Mask 28 contains regions of transparent and opaque material. Chromium is most commonly used as the opaque material and is designated as reference numeral 30.

Illustrated in FIG. 2 is a plurality of light beams which travel through mask 28 in regions not containing opaque structures. Light beams 32 include transmitted beams 34 and reflected beams 36. Transmitted beams are defined as those which impinge upon photoresist 26 and terminate at the lower boundary between photoresist 26 and metallization 24. Reflected beams are those beams which reflect from metallization 24 and back into photoresist 26. Reflection can occur perpendicular to the upper surface of photoresist 26 provided metallization layer is substantially parallel to that upper surface. However, if metallization layer, being somewhat reflective, is not perpendicular to the upper surface of photoresist 26, then reflected beams 36 disperse laterally within photoresist 26.

As defined herein, metallization layer 24 is any layer of conductive material connected between elements placeable upon substrate 12. The elements may be circuit devices integrated upon a single monolithic device, or they may be printed wiring board leads which require interconnect to couple the circuits or leads together at selected locations. Accordingly, metallization layer 24 can be any conductive layer including, but not limited to, metallic films which can be etched in an elongated trace interconnect having a resistance in the range less than 100 $\Omega$/cm of length. Metallization layer 24 can be made of an aluminum metallic compound or any other form of metallic, low-resistive material which (i) is easy to deposit, (ii) adheres well to underlying insulating material 22, (iii) provides a good ohmic contact to underlying diffusion areas, and (iv) is easy to selectively etch.

Metallization 24 can be placed across the entire surface region using varying techniques including but not limited to vacuum deposition. Vacuum deposition implies filament evaporation, electron beam evaporation and sputtering techniques well known in the art. Furthermore, chemical vapor deposition (CVD) and electroplating can also be used as suitable methods of coating a thin film of highly conductive material 24.

FIG. 2 illustrates the movement of demarcation line 38 separating solubilized and polymerized photoresist. Reflected beams 36 extend laterally from the upper reflective surface of metallization layer 24 to an area directly above the desired final interconnect structure 40. As such, demarcation line 38 moves from a target position to an area laterally to the right or left of its original position (provided upper surface of photoresist is configured in a horizontal plane as shown). Using positive photoresist and the example shown in FIGS. 2 and 3, structure 40 appears somewhat smaller in size than its desired configuration. The smaller shape is caused by "notching" or developing of photoresist above the desired interconnect shape. More photoresist is exposed in a lateral direction causing the resulting notching effect near the periphery of the shape. Photoresist is removed by a suitable solvent, the underlying structure 40 is slightly removed at one or more edges of its outer periphery underneath the exposed or notched photoresist. Shown in FIG. 3 is a resulting trace structure 40 having a notched outer edge angled toward the sloped, steeply angled surface from which beam 36 is reflected.

Notching of an interconnect is a result of both (i) a reflective surface underneath the photoresist and (ii) severe sloping sidewalls of a reflective surface spaced near the interconnect structure. The sloped reflective surface is brought about by previous photolithography steps. Whether the underlying surface is metallization or is an insulating material, either surface is reflective of impinging UV radiation. While notching cannot be eliminated, more recent conventional photoresist such as inorganic-based photoresist can be used which limits notching. In an effort to minimize notching, removal of the photoresist directly perpendicular to the photoresist surface is always desired and can be greatly enhanced by anisotropic, inorganic photoresist. Inorganic photoresist proves impractical in many applications. In addition, inorganic photoresist cannot entirely eliminate the notching phenomena.

If notching cannot be entirely eliminated, it is important that it be monitored to determine its effect on the resulting product. It would be advantageous to model a test structure susceptible to notching and to characterize the resulting product according to the magnitude of the notching effect demonstrated in the test structure. If the magnitude of notching can be accurately measured during the photolithography process, the cause of product failure can be characterized more accurately and possibly attributed to notching. As such, it is important that a test structure be used to monitor and attribute notching magnitude to each resulting product. The operator can then make a valued decision as to a threshold amount of notching of which the photolithography process cannot exceed and still produce operable conductive components or interconnect.

SUMMARY OF THE INVENTION

The problems associated with testing, monitoring and evaluating notching on a product-by-product basis is in large part solved by the photolithography test structure of the present invention. That is, the test structure hereof utilizes a reflective surface from which light beams are reflected. The reflective surface includes at least one sloped sidewall arranged in close proximity to a desired interconnect structure. The reflective surface with sloped sidewalls is deposited a spaced distance from the interconnect structure formed from a conductive metallization film.

Accordingly, the test structure can be processed accordingly to normal photolithography parameters or steps and upon the same monolithic bulk substrate as that which contains the resulting product—e.g., integrated circuit or printed circuit board. The test structure hereof provides accurate notching indicia upon the test interconnect structure corresponding to normal lithographic notching occurring within the resulting product. As more notching is present (possibly due to processing parameters, choice of photoresist, solvents, etchants and the steepness of the underlying reflective topography), the width of the ensuring interconnect structure is lessened. If interconnect width is too small, vis-a-vis a higher resistivity, the product (e.g., circuit) may cease to function. Interconnect width can be accurately measured by applying a current through the interconnect formed from the test structure. A corresponding voltage across the interconnect can then be measured. A known voltage and current will allow the operator to ascertain resistance and thereby extrapolate interconnect width (which is a direct function of notching).

Broadly speaking, the present invention contemplates a photolithography test structure. The test structure comprises a substrate and a first curved insulating structure having sloped sidewalls deposited upon the substrate. An interconnect structure is deposited upon the substrate a spaced distance from the first insulating structure. A pair of conductive pads are deposited upon the substrate and connected at opposite ends of the interconnect structure. The test structure further comprises a second curved insulating structure having sloped sidewalls deposited upon the substrate a spaced distance from the interconnect structure, whereby the interconnect structure is configured between the first insulating structure and the second insulating structure. The first insulating structure comprises silicon dioxide or, alternatively, a chemical selected from the group consisting of tetraethoxysilane and phosphosilicate glass. The spaced distance between the insulating structure and the interconnect structure is less than 1.0 μm or, possibly less than 0.75 μm.

The first curved insulating structure may be a serpentine shaped film deposited upon the substrate. The sidewalls of the insulating structure extend substantially perpendicular to the substrate. The sidewalls can be reshaped to extend in a sloping path from a peak of the insulating structure to an outer periphery at a base of the insulating structure. A second serpentine shaped insulating structure having sloping sidewalls can be deposited upon the substrate a spaced distance from the interconnect structure, whereby the interconnect structure is configured between the first insulating structure of serpentine shape and the second insulating structure of serpentine shape. The serpentine shaped first and second insulating structures extends within a single plane, each structure extends in a lateral fashion about two separate elongated central axes. Select portions of insulating structure comprise a plurality of sidewalls spaced at a distal location from the elongated central axis. A current can be produced between pads placed at opposite ends of the interconnect structure and a resulting voltage can be measured between the pads.

The present invention further contemplates an integrated circuit photolithography test structure comprising a silicon substrate and a first insulating film deposited across the substrate. The first insulating film can be selectively etched away from the substrate to produce a first topography, wherein the topography includes a serpentine-shaped first insulating structure which extends within a plane laterally about an insulating structure central axis. Insulating structure includes a plurality of sloped sidewalls spaced at a distal location from the insulating structure central axis. A conductive film is deposited across the first topography to form a second surface topography. A photoresist is placed across the second topography and a mask configured proximate to the second topography. A plurality of light beams comprising transmitted light beams and reflected light beams are configured onto and from, respectively, the first topography. Transmitted light beams includes light beams sent through the mask and upon the second topography. Reflected light beams include light beams reflected from the first topography. Select areas of photoresist are solubilized in areas receiving transmitted and reflected light beams. Conductive film in areas underlying the solubilized resist are etched away to produce a third surface topography, wherein the third topography includes an elongated interconnect structure placed a spaced distance less than 1.0 μm from the plurality of sloped sidewalls. Current may be produced through the interconnect structure along the interconnect central axis whereby resistance is measure through the interconnect. Resistance can be correlated to an amount of reflected light beams extending from the first topography to a photoresist location above at least a portion of the outer periphery of the interconnect structure.

The interconnect structure includes a length, a thickness, and a width. The length extends parallel to the second topography along the interconnect central axis. The thickness extends perpendicular to the second topography to an upper surface of the interconnect, and the width extends parallel to the second topography and perpendicular to the thickness and length of the interconnect. The width decreases as a result of an increase in reflected light beams extending from the first topography to a photoresist location above an outer portion of the interconnect. Increase of resistance through the interconnect correlates with a decrease in the interconnect width.

BRIEF DESCRIPTION OF THE DRAWINGS

Other objects and advantage of the invention will become apparent upon reading the detailed description and upon reference to accompanying drawings in which.

Figure 1:
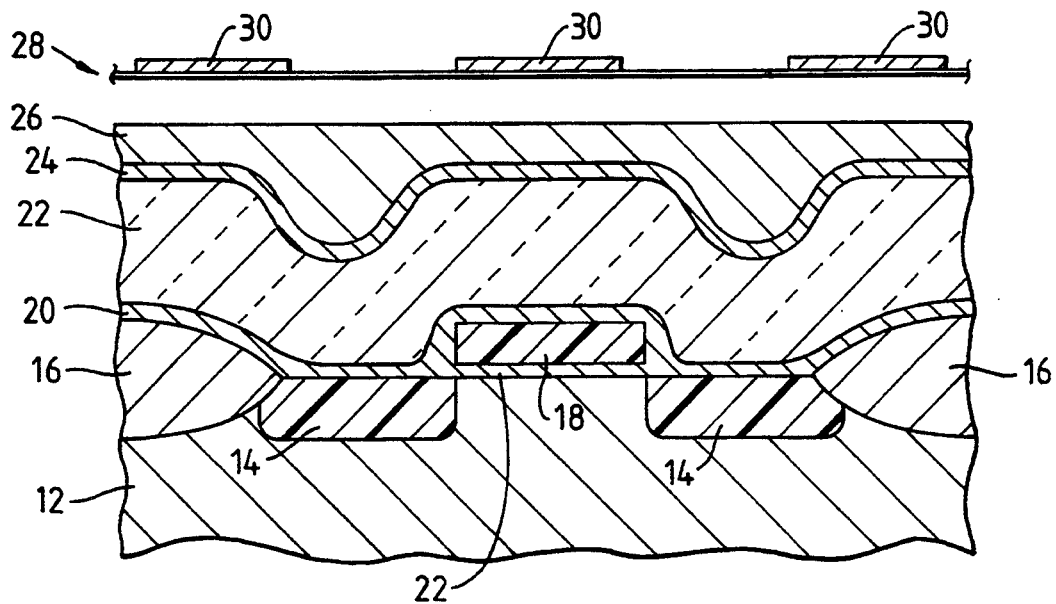
FIGS. 1-3 is an enlarged cross-section view of a product formed from a photolithography process.
Figure 2:
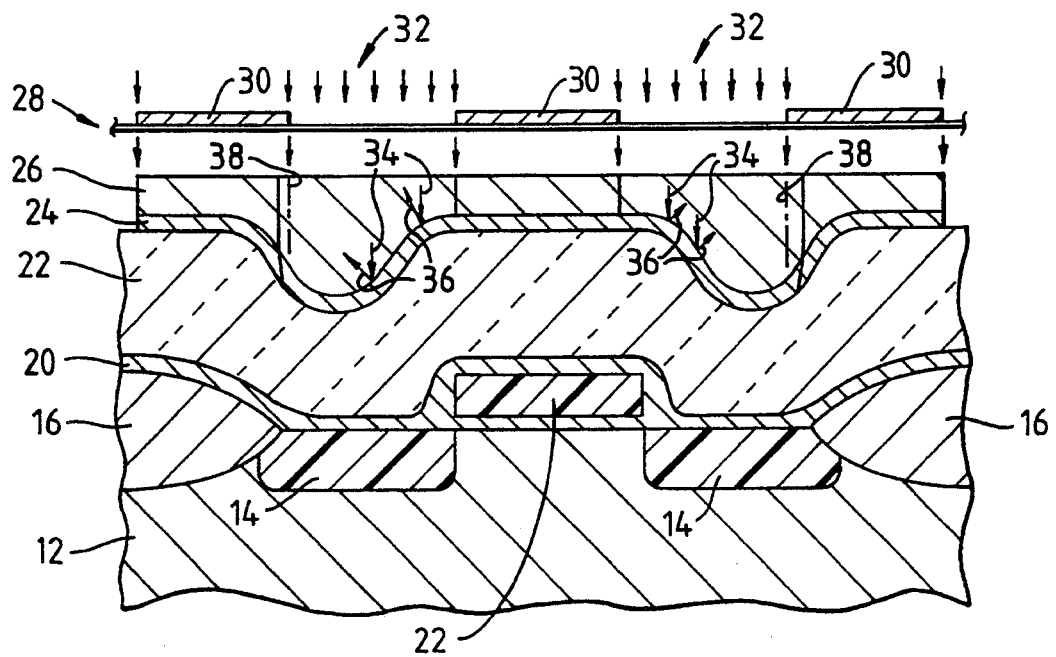
Figure 3:
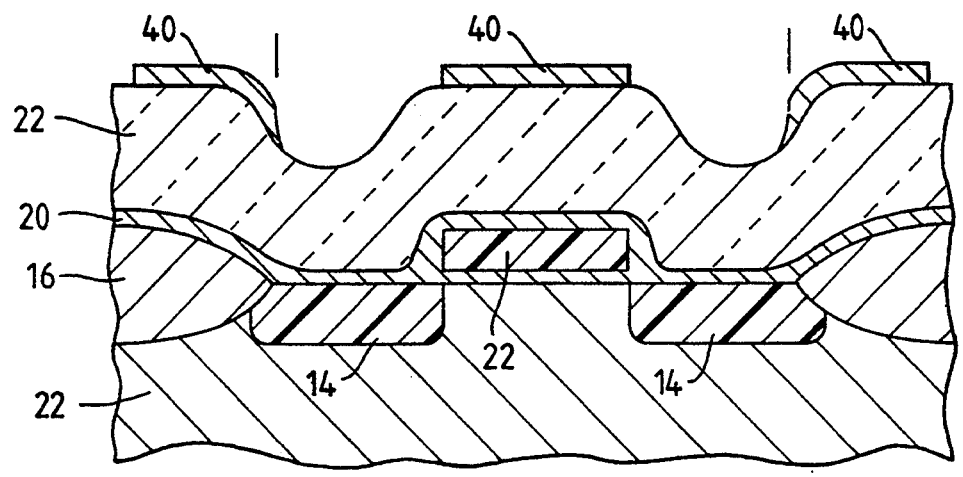

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 4:
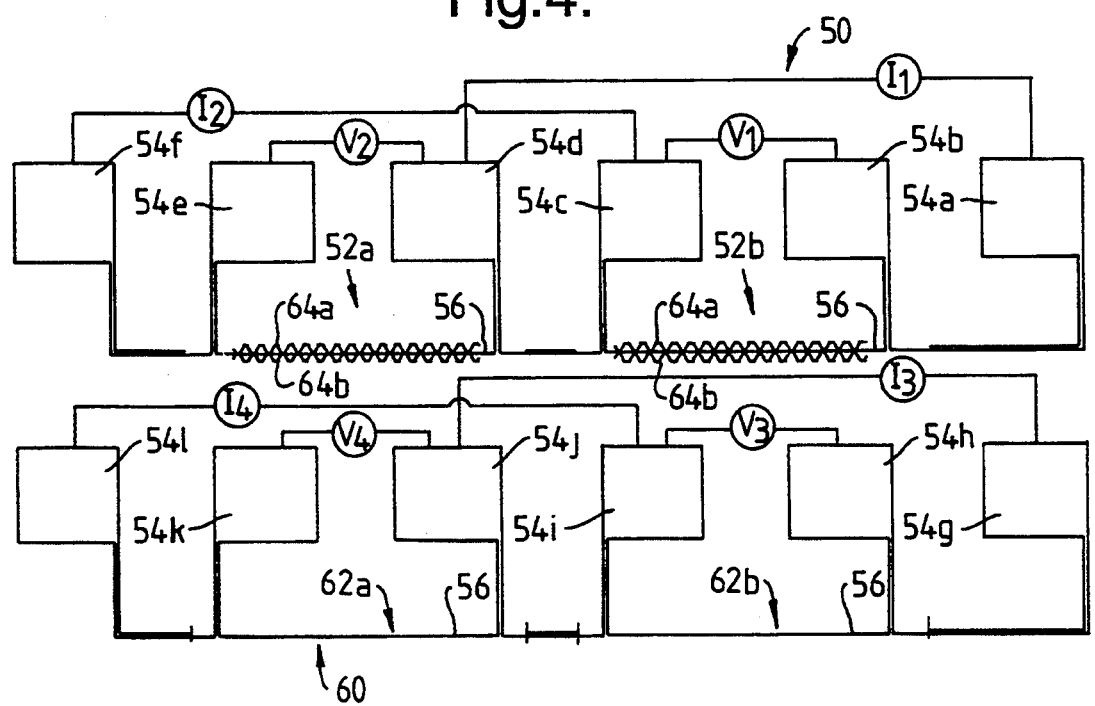
FIG. 4 is a top plan view of a photolithography test structure according to the present invention.

Turning now to the drawings, FIG. 4 illustrates a top plan view of a photolithography test structure 50 according to the present invention. Test structure 50 includes at least one test area 52 configured between a pair of conductive pads 54. Pads 54 are connected at opposite ends of an interconnect structure 56. A control structure 60 is also provided having at least one control test area 62 configured between a pair of conductive pads. Pads 54 are arranged in order to receive current provided by sources $I_1$, $I_2$, $I_3$, and $I_4$ as shown. Select pads can be probed by voltage meters $V_1$, $V_2$, $V_3$ and $V_4$ to determine the voltage across the interconnect structure between pads. In the exemplary configuration shown, current $I_1$ is drawn between pads 54a and 54d and resulting voltage $V_1$ is measured across pads 54b and 54c. Knowing the voltage and current across structure 56 allows an operator to determine resistance. If current $I_3$ is substantially equal to current $I_1$ and voltage $V_3$ is substantially equal to voltage $V_1$, then the operator can deduce that the resistance of structure 56 within control test area 62b is approximately the same as the resistance of structure 56 within test area 52b. Thus, by setting corresponding drive currents substantially equal across the test and control areas, the operator can measure resistance change of the test area in relation to the control area and thereby determine relative amounts of notching. Test area 52a and control area 62a operate similar to test area 52b and control area 62b. By equalizing drive currents $I_2$ and $I_4$, control area 62a provides a relative test point of which test area 52a can be compared.

It is appreciated from the present invention that the arrangement of current and voltage (meters or sources) can be modified and placed on various other select pads dissimilar from those shown and still provide the same function: to drive current through or voltage across a test area and measure the resulting resistance relative to the control area. It is further appreciated that test area 52a may be configured dissimilar from test area 52b. For example, test area 52a may include an interconnect structure placed closer to or further from curved insulating structure 64 than the interconnect structure within test area 52b. Alternatively, interconnect structure may be placed closer to the upper insulating structure 64a than to lower insulating structure 64b. Moreover, the interconnect structure of area 52a may be narrower or wider than the interconnect structure of area 52b. Preferably, interconnect structure 52a is maintained approximately the same thickness as the structure (e.g., 62a) on which a control test is performed. Alternative configurations all provide a testing guide post on which more data can be collecting about the notching phenomena.

Interconnect structure 56 is preferably formed by a photolithography process on the same monolithic structure or substrate as that of the resulting, processed product. According, test structure 50 can be placed anywhere within an integrated circuit wafer, within a printed circuit board, or within any structure formed by photolithography. Interconnect 56 is formed according to the same photolithography steps and simultaneous with the steps taken to form the product requiring photolithography test. Preferably, interconnect 56 is produced by etching away portions of a conductive film deposited across the same surface topography as the resulting product. A suitable conductive film includes any low-resistance film such as a metallic film. After the film is deposited and overlying photoresist is exposed to UV light, exposed photoresist is removed according to standard developing procedures described above. Underlying portions of exposed metallization layer are etched away thereby leaving a thin strip of interconnect placed between pads 54 and/or pads 60. Interconnect 56 includes a length extending between the pads, a thickness extending perpendicular to the substrate upon which the interconnect is formed, and a width extending perpendicular to the interconnect length and thickness. Width of interconnect 56 can vary depending upon the initial targeted or desired width minus any notching which may occur whenever reflective surfaces are placed close to the interconnect.

A preferred initial starting width for interconnect 56 can range anywhere from 0.5 $\mu$m to 2.0 $\mu$m. For example, test area 52a may include interconnect 56 having an initial width of 1.0 $\mu$m, whereas interconnect 56 within test area 52b can have an initial width of 2.0 $\mu$m. A similar configuration can apply to test areas 62a and 62b. Interconnect within area 62b can be 2.0 $\mu$m in width as opposed to 1.0 $\mu$m in width within area 62a. Dissimilar initial interconnect width provides the test operator with an indication of the effect of notching upon varying interconnect sizes. Notching may be more prevalent if interconnect width is small. The initial, small width interconnect can possibly be notched entirely away leaving a complete open circuit in area such as 52a, while area 52b remain conductive. Thus, it is important to vary interconnect width in order to determine a threshold width in which notching may cause a complete open circuit.

Test area 52a can be easily compared against controlled area 62a by applying similar current through interconnect 56 within each area, and then measuring the resultant resistance within each interconnect. If, for example, resistance through interconnect 56 within area 52a is more than resistance through interconnect 56 within area 62a, then it becomes apparent that some notching has taken place. Depending upon the magnitude or difference between the measured resistances, a quantifiable amount of notching can be extrapolated. For example, if resistance in area 52a is twice that of area 62a, then a direct correlation arises indicating that notching has removed approximately one half the width of interconnect 56 within area 52a. The same result applies when comparing resistance between areas 52b and 62b. Although interconnect 56 within areas 52b and 62b are wider than in areas 52a and 62a, a direct correlation between resistance and notching effect still remains. That is, even if area 52a reads an open circuit, area 52b may still contain measurable resistance (albeit a much larger resistance than 62b) thereby allowing the operator to determine the amount of notching even if one test area fails.

Figure 5:
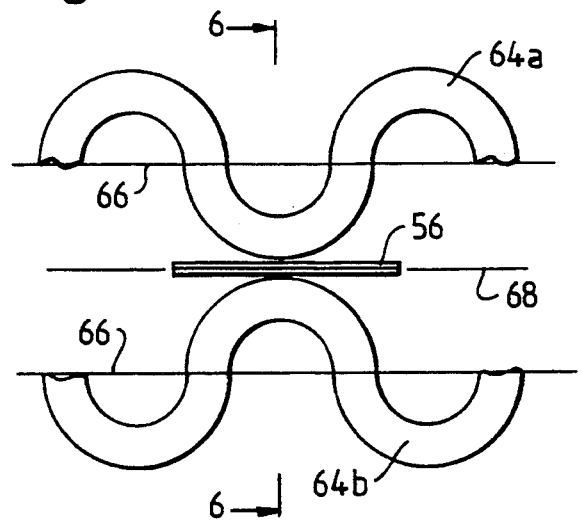
FIG. 5 is a detail view of a portion of the photolithography test structure according to the present invention.

Referring now to FIG. 5, a detailed top view of a portion of test area 52 is illustrated. Interconnect 56 is placed in close proximity to the outer edge of a curved insulating structure 64. The outer sidewall of interconnect 56 is preferably placed within 1.0 $\mu$m of outer sidewall of insulating structure 64. Insulating structure 64 is preferably serpentine in shape having a plurality of sidewalls spaced within 1.0 $\mu$m from the outer edge of interconnect structure 56. Serpentine shaped structure 64 is formed upon a substrate topography and extends within a plane and laterally about an elongated central axis 66. Central axis is spaced parallel to a central axis 68 along which interconnect structure 56 extends. Two insulating structures 64a and 64b can be placed a spaced distance from opposing sides of interconnect 56. Similar to first insulating structure 64a, second insulating structure 64b is placed on the surface topography spaced equi-distance from interconnect 56. Thus, first and second insulating structures 64a and 64b provide a notching test area 52a.

It is appreciated from the present invention that only select portions of insulating structure 64 are placed within 1.0 $\mu$m of the outer edge of interconnect structure 56. Because insulating structure curves about central axis 66 in a serpentine fashion, only select portions are brought within the test space area and only at select areas along the interconnect length. By using a serpentine insulating structure, the present invention achieves not only measurable resistance differentiation through interconnect 56, but visual differentiation as well. The operator can visually examine structure 56 to discover possible notching in the select regions where spacing between structures 64 and 56 are minimal. In all other regions, interconnect structure 56 is not notched. If insulating structure 64 is not curved, but is substantially straight and formed within close proximity of structure 56, then any misalignment between structure 64 and 56 may cause an open circuit and thereby prevent resistance readings. Therefore, an advantage of the present invention is the ability to maintain resistance readings even during slight misalignment, and furthermore, visual inspection of wide and narrow interspersed regions along the interconnect allows the operator to visually determine the amount of notching even if misalignment prevents resistive readings.

Figure 6:
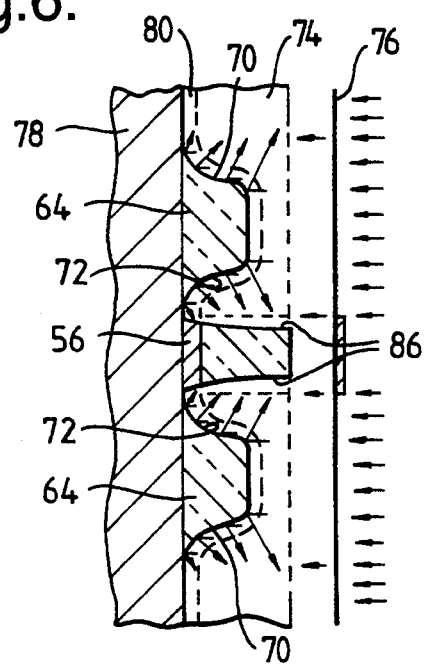
FIG. 6 is a cross-section view of the photolithography test structure formed along plane 6 of FIG. 5 according to the present invention.

Referring now to FIG. 6, a cross-section view along plane 6 of FIG. 5 is illustrated during a photolithography processing step. Curved insulating structures 64 are shown having sloped sidewalls 70. Insulating structure 64 can be made of any insulating material including silicon dioxide, silicon nitride, silicon and/or glass material, etc. Insulating material is preferably chosen in order that the base 72 of insulating sidewall does not conduct current when or if it comes in contact with the base of conductive interconnect 56. Base 72 may extend laterally outward from its initial position during reflow or high temperature bake of insulating structure 64. Reflow often occurs during the formation of silica from initial liquid glass, or can occur from thermal oxidation of initial silicon. Reflow tends to smooth the upper and lower corners and forms a more sloping sidewall 70 extending from the reformed upper and lower corners. As indicated in FIG. 6, after insulating structure is baked, base 72 extends within 1.0 μm (and in some instances within 0.5 μm) of the outer edge of interconnect structure 56.

Using a positive photoresist 74 merely as an example, UV radiation transmitted through mask 76 exposes photoresist 74 in select regions as indicated and known in the art. A first surface topography including the serpentine-shaped first and second insulating structures 64 is placed upon substrate 78. First topography is configured to receive a metallized film 80 to form a second topography. Photoresist 74 is then placed across metallized film 80 by normal spin routine and UV radiation is transmitted through mask 76 as shown. Light beams transmitted through mask 76 reflect from metallized surface 80 in areas of steep sidewalls 70 and the reflected beam extends laterally into photoresist immediately and directly above interconnect 56. As such, the notching phenomena is demonstrated in the test structure forcing photoresist 74 to be removed directly above a portion of a periphery of interconnect structure 56. Accordingly, after etch, the resulting interconnect 56 may be somewhat thinner than the initial target size and will have sidewalls which are no longer perpendicular to the upper surface of the substrate or photoresist. Instead, sidewalls of interconnect 56 diverge inward as shown in FIG. 7 by reference numeral 82.

Figure 7:
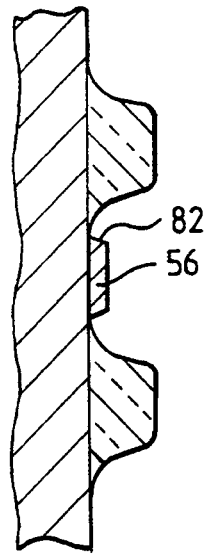
FIG. 7 is a cross-section view of a portion of the photolithography test structure according to the present invention.

As shown in FIG. 7, a portion of the final test structure is illustrated having interconnect structure 56 of lesser width than the target or desired width. Lesser width is caused by the movement of polymerized/-solubilized demarcation line 84 from an ideal location, illustrated by dashed lines, to a displaced location illustrated by reference numeral 84 of FIG. 6. Because underlying metallization film at the interconnect areas are no longer protected by hardened or polarized photoresist, portions of the outer edge of interconnect 56 are etched during the etching process. If lateral etching is significant, caused by notching, then the width of interconnect 56 can be easily correlated to a resistance value and measured by test structure It will be appreciated to those skilled in the art having the benefit of this disclosure that this invention is believed to be capable of applications with numerous types of insulating or conducting structures. Furthermore, the steps used in producing the insulating and conducting structures can be varied provided they remain consistent with the steps taken to produce the desired product formed on the same monolithic body. Various modifications and changes may be made without departing from the spirit and scope of the invention as set forth in the claims. An exemplary modification might be one which uses dissimilar types of substrate material, dissimilar amounts of voltage and current sources, and various types of positive photoresist. It is intended that the following claims be interpreted to embrace all such modifications and changes.

What is claimed is:

1. A photolithography test structure for measuring notching upon an interconnect structure comprising:
   a substrate;
   a first curved insulating structure having a sloped sidewall deposited upon said substrate;
   an interconnect structure deposited upon said substrate a spaced distance from said sloped sidewall; and
   a pair of conductive pads deposited upon said substrate and connected at opposite ends of said interconnect structure, said pair of conductive pads are adapted to receive electrical energy for measuring an amount of notching upon said interconnect structure.

2. The test structure as recited in claim 1, further comprising a second curved insulating structure having a sloped sidewall deposited upon said substrate a spaced distance from said interconnect structure, whereby said interconnect structure is configured between said first insulating structure and said second insulating structure.

3. The test structure as recited in claim 1, wherein said first insulating structure is chemically bonded to said substrate in a serpentine configuration.

4. The test structure as recited in claim 1, wherein said first insulating structure comprises silicon dioxide.

5. The test structure as recited in claim 1, wherein said first insulating structure comprises a chemical selected from the group consisting of tetraethoxysilane and phosphosilicate glass.

6. The test structure as recited in claim 1, wherein said interconnect structure comprises a metal.

7. The test structure as recited in claim 1, wherein said interconnect structure is chemically bonded to said substrate in an elongated, substantially straight configuration.

8. The test structure as recited in claim 1, wherein said spaced distance is less than 1.0 μm.

9. The test structure as recited in claim 1, wherein said spaced distance is less than 0.75 μm.

* * * * *